(12) United States Patent
Martinent et al.

(10) Patent No.: US 7,837,122 B2
(45) Date of Patent: Nov. 23, 2010

(54) METHOD OF MANUFACTURING A SUBSTRATE FOR A MINI-UICC SMART CARD WITH AN ASSOCIATED PLUG-IN UICC ADAPTER, AND A RESULTING SUBSTRATE

(75) Inventors: Jean-François Martinent, Aix en Provence (FR); Jean-Christophe Fidalgo, Gemenos (FR)

(73) Assignee: Gemalto SA, Meudon (FR)

( * ) Notice: Subject to any disclaimer, the term of this patent is extended or adjusted under 35 U.S.C. 154(b) by 575 days.

(21) Appl. No.: 11/631,813

(22) PCT Filed: Jun. 2, 2005

(86) PCT No.: PCT/EP2005/052544
§ 371 (c)(1),
(2), (4) Date: Jan. 15, 2008

(87) PCT Pub. No.: WO2006/010664
PCT Pub. Date: Feb. 2, 2006

(65) Prior Publication Data
US 2008/0251587 A1      Oct. 16, 2008

(30) Foreign Application Priority Data
Jul. 8, 2004    (FR)    .................................. 04 51478

(51) Int. Cl.
*G06K 19/06*    (2006.01)
(52) U.S. Cl. ...................................................... 235/492
(58) Field of Classification Search ................. 235/492; 257/679
See application file for complete search history.

(56) References Cited

U.S. PATENT DOCUMENTS

| | | | | |
|---|---|---|---|---|
| 4,639,585 A | * | 1/1987 | Haghiri-Tehrani et al. | .. 235/492 |
| 4,764,803 A | * | 8/1988 | Ueda | ........................... 257/679 |
| 5,362,955 A | * | 11/1994 | Haghiri-Tehrani | .......... 235/492 |
| 5,581,065 A | * | 12/1996 | Nishikawa et al. | .......... 235/492 |
| 5,936,227 A | * | 8/1999 | Truggelmann et al. | ...... 235/492 |
| 6,028,774 A | * | 2/2000 | Shin et al. | .................... 361/764 |
| 6,065,681 A | * | 5/2000 | Trueggelmann | .............. 235/487 |
| 6,372,541 B1 | * | 4/2002 | Bouchez et al. | ............. 438/106 |

(Continued)

FOREIGN PATENT DOCUMENTS

DE    298 19 389 U1    11/1999

(Continued)

OTHER PUBLICATIONS

International Search Report dated Feb. 1, 2006.

*Primary Examiner*—Daniel A Hess
(74) *Attorney, Agent, or Firm*—Buchanan Ingersoll & Rooney PC

(57) ABSTRACT

A method of producing a smart card having a reduced format in relation to a second standard format and an adapter with the second format, which is associated with the smart card. A card body has a zone for the extraction of the smart card and a zone for the extraction of the adapter. At least the smart card is extracted from the support. The smart card is extracted from a zone located outside the peripheral outline of the adapter extraction zone. The invention also relates to the support thus obtained.

21 Claims, 2 Drawing Sheets

U.S. PATENT DOCUMENTS

| | | | |
|---|---|---|---|
| 6,448,638 B1 * | 9/2002 | Fidalgo et al. | 257/679 |
| 6,561,432 B1 * | 5/2003 | Vedder et al. | 235/492 |
| 6,653,565 B2 * | 11/2003 | Kashima | 174/521 |
| 6,685,097 B1 * | 2/2004 | Housse | 235/492 |
| 6,964,377 B1 * | 11/2005 | Haghiri et al. | 235/492 |
| 7,183,636 B1 * | 2/2007 | Boccia et al. | 257/679 |
| 7,597,250 B2 * | 10/2009 | Finn | 235/380 |
| 2002/0160630 A1 * | 10/2002 | Kashima | 439/55 |
| 2009/0040695 A1 * | 2/2009 | Fidalgo et al. | 361/679.31 |

FOREIGN PATENT DOCUMENTS

FR    2 778 002 A    10/1999

* cited by examiner

METHOD OF MANUFACTURING A SUBSTRATE FOR A MINI-UICC SMART CARD WITH AN ASSOCIATED PLUG-IN UICC ADAPTER, AND A RESULTING SUBSTRATE

The present invention relates to the field of mini smart cards.

It relates more particularly to a method of manufacturing a smart card (a mini Universal Integrated Circuit Card (mini-UICC)) having a format that is smaller than a second standard format (plug-in UICC), and of manufacturing an adapter for adapting to the second format (plug-in UICC) associated with the smart card.

Three main standard smart card formats exist on the market. The first format is the format relating to the Standard ISO 7816: 54 mm×85 mm×0.76 mm for smart cards essentially intended for operations such as, for example, communications, identification, or teleticketing.

The second format relates to the standard for the "plug-in UICC" that is essentially intended for insertion into a mobile telephone, but that can optionally be used in other communications devices or players of the USB type. A plug-in UICC has a card body that is rectangular in shape and of dimensions 15 mm×25 mm×0.76 mm, with a 3 mm×3 mm polarizing slot in one corner of the substrate of the card.

The third format, which has been in existence since 2004, relates to cards referred to as third generation "3G plug" or "mini-UICC" cards whose reduction in format results in particular from the trend for miniaturizing mobile telephones. The standardized format is 15 mm×12 mm×0.76 mm, also with a 2.5 mm by 2.5 mm polarizing slot in one corner of the substrate of the card.

Various methods of manufacturing a plug-in UICC adapter are known in which a format adapter is extracted manually from a first substrate whose format is the ISO format, thanks to a pre-cutout according to the adapter format.

Thus, Patent Application FR 9906729 shown in FIGS. 1 and 2 provides a plug-in-UICC-to-small-card-(mini-UICC) adapter that is shaped to receive a mini-UICC 60 or a "3G plug" (third generation). The adapter 100 is defined by a pre-cutout 20 in an ISO-format card body 200, and then it is extracted manually from said body 200 by breaking the bridges 22, 24, and 26.

Optionally, in a variant, the adapter can be manufactured directly to the final format, in particular by injection molding.

The mini-UICC card is then fastened inside the adapter for use at the plug-in or ISO format. It is also provided with a suitable profile 130, 140 enabling it to be locked in the adapter which is provided with a complementary profile 110 enabling the mini-UICC card to be mounted removably.

Attempts have also been made by the inventors to extract the mini-UICC directly from inside the zone reserved for the adapter, i.e. from the final location of the UICC in the adapter.

Those attempts have not led to technical solutions that are satisfactory as regards repositioning in the adapter.

In addition, various possible methods of manufacturing a mini-UICC card or an adapter consist in:

extracting the mini-UICC card from an ISO card directly by punching it out, or after it has been pre-cut-out;

molding it separately to the final format; and extracting a plurality of mini-UICC card bodies or a plurality of adapters, by mechanically cutting them out from a plastics sheet.

Finally, when a subscriber identity card is supplied to the end user, said end user is also given confidential information (by way of non-limiting example: a Personal Identity Number (PIN) and a PIN Unblocking Key (PUK)). To this end, it is known that such accompanying information can be printed on a sheet of paper or else it can be disposed on an ISO-format card body for subsequent distribution. It is also known that such information can be disposed on a detachable portion of an ISO-format plastics card (not provided with a chip, i.e. not a smart card).

Methods implemented for supplying such a Subscriber Identity Module (SIM) card, such adapters, and such accompanying information suffer from the drawback of requiring special tooling and multiple operations that are ultimately costly.

An object of the invention is to solve the above-mentioned problems.

A main object of the invention is to design a manufacturing method that makes it cheaper to supply an adapter and a mini-UICC, or optionally confidential information.

In order to make industrialization easier and cheaper, it has been found that it is necessary to use to a maximum extent the common steps involved in manufacturing the adapter and the mini-UICC and optionally in supplying the confidential information, while also avoiding the previously encountered feasibility problems.

To this end, the invention provides a method of manufacturing a smart card (mini-UICC) having a format that is smaller than a second standard format (plug-in UICC), and of manufacturing an adapter for adapting to the second format (plug-in UICC) associated with the smart card, said method comprising the following steps consisting in:

supplying a card body having a zone from which to extract the smart card and a zone from which to extract the adapter; and extracting at least the smart card (mini-UICC) from the substrate.

The method is remarkable in that it further comprises a step consisting in extracting the smart card from a zone situated outside a peripheral outline of the zone from which to extract the adapter.

Preferably, a substrate is used that has a prior standard format (ISO) that is larger than the second format (plug-in UICC).

According to other characteristics:

the method further comprises a prior step consisting in extracting a first sub-portion having the second standard format (plug-in UICC) and including the smart card;

the method further comprises a prior step consisting in extracting a second sub-portion of substrate including the smart card from the substrate;

the method further comprises a prior step consisting in extracting a third sub-portion of substrate including the adapter from the substrate;

the method further comprises a step consisting in extracting at least three sub-portions from the substrate, the three sub-portions respectively including said zone from which to extract the smart card, personal information, and said zone from which to extract the adapter;

the various extractions are performed manually along score lines;

the various extractions are made by mechanical cutting-out means;

the smart card (mini-UICC) is situated on the substrate in a manner such that at least one integrated-circuit module insertion operation is performed substantially in same way as for an ISO-format smart card; and the various pre-cutouts or score lines are formed directly in the injection mold during a plastics injection molding operation for molding the substrate.

The invention also provides a smart card substrate including a zone from which to extract a smart card (mini-UICC) having a format that is smaller than a second standard format (plug-in UICC), and a zone from which to extract an adapter for adapting the smart card to the second format (plug-in UICC).

The smart card substrate is remarkable in that the zone from which to extract the smart card is situated outside the peripheral outline of the zone from which to extract the adapter.

Preferably, the substrate has a prior standard format (ISO) that is larger than the second format (plug-in UICC).

According to other characteristics, the substrate includes:

a first sub-portion having the second standard format (plug-in UICC) and including the smart card;

a second sub-portion of substrate including the smart card;

a third sub-portion of substrate including the adapter;

information and a score line isolating the information on a fourth detachable sub-portion of substrate; and at least three detachable sub-portions defined by score lines and respectively including said zone from which to extract the smart card, said information, and said adapter;

the various extraction zones are defined or marked by score lines facilitating manual extraction;

said information includes information relating to PIN and/or PUK codes;

the contact regions of the smart card correspond substantially to the standardized locations of the contact regions on an ISO card; and the adapter has a location in the substrate such that the contact regions of the smart card, as placed in it, correspond substantially to the standardized locations of the contact regions of an ISO card.

Other features and advantages of the invention appear on reading the following description given by way of non-limiting example and with reference to the accompanying figures, in which.

In the method, the smart card (mini-UICC) that has a smaller format than a second standard format (plug-in UICC), and an adapter to the second format (plug-in UICC) associated with the smart card are extracted from the same substrate.

Figure 3:
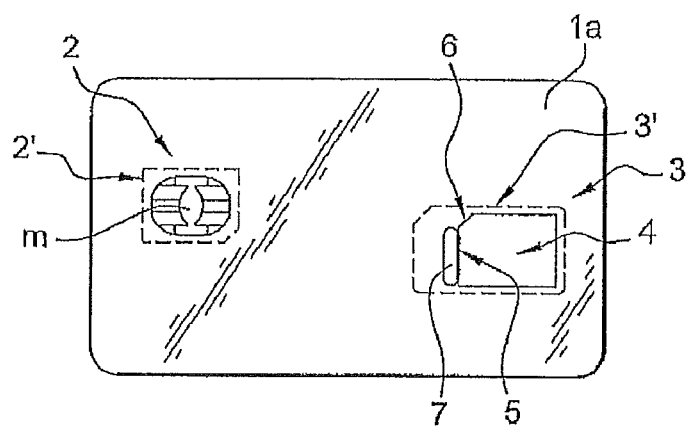
FIG. 3 is a plan view of a substrate having the ISO format, of an adapter, and of the mini-UICC of the invention.

With reference to FIG. 3, an ISO-format substrate (1a) is preferably used so as to make use of the existing and tried and tested smart card production facilities. In general, a substrate is used that has a prior standard format that is larger than the format of the small mini-UICC, and than the second format.

However, other formats could be used provided that they offer at least two zones reserved for extracting the adapter and the mini-UICC. In accordance with the invention, the adapter and the mini-UICC are extracted from two distinct zones of the card body, unlike in the prior art in which the mini-UICC and the adapter are manufactured on two different substrates.

More particularly, the smart card 2 is extracted from a zone situated outside a peripheral outline defining the zone from which to extract the adapter 3 (including the pre-cutout slot 3').

The substrate 3 is a card body made of a plastics material such as acrylonitrile-butadiene-styrene copolymer (ABS), polyvinyl chloride (PVC), polyethylene terephthalate (PET), etc. and it can be obtained in various manners known in the smart card field, in particular by injection molding or by lamination. Said substrate is provided with a cavity for receiving a module (m). In known manner, the module has contact regions or pads connected to an integrated circuit chip and resting on a dielectric film.

Figure 1:
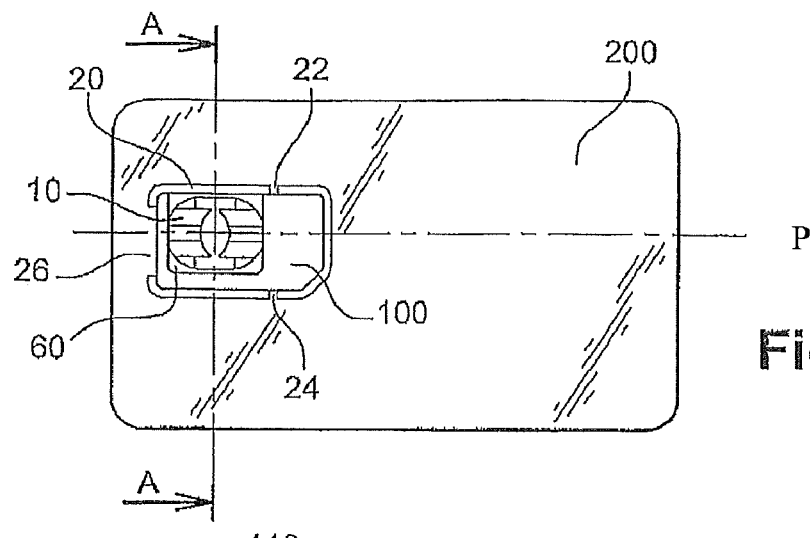
FIG. 1 (described above) is a diagrammatic plan view of mini-UICC in a card having the current ISO Standard format, and including an adapter.
Figure 2:
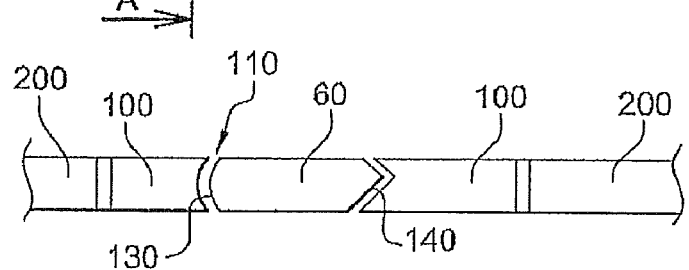
FIG. 2 is a section view of FIG. 1 on A-A.

In a variant, the card body is obtained directly by injection molding with the predefined shapes of the adapter 3, i.e. with the space for receiving the mini-UICC (recess 4) and/or an adapted profile, e.g. a concave profile like the profile (110) in FIG. 2, and with the pre-cutouts 2' of the mini-UICC, inside which pre-cutouts a cavity is situated that serves to receive the module (m). Optionally resilient mounting means are provided: a resilient blade 5 on one edge of the space for receiving the mini-UICC.

In the example, it is the transverse edge adjacent to the polarizing slot 6 that is concerned.

Said blade is obtained by means of a second recess 6 in the card body of the adapter. For this purpose, the injection molds include mold cores or punches that are mounted to move and that are adapted to forming said recesses.

The recesses can also be formed by machining.

After integrated-circuit module insertion, and optionally after electrical customization, testing, and graphics printing, it is then possible to extract the mini-UICC and/or the adapter.

Thus, advantage can be taken of steps that are common, such as injection, printing, and graphics customization, and a single production line can be used to make both of the bodies: mini-UICC and adapter.

Extraction can take place at different times, by cutting out or punching out the mini-UICC and/or the adapter. Both elements are then packaged together, optionally with a substrate or other medium containing information relating to the card. The card, the adapter, and the information can, for example, be bagged together or fastened with adhesive to a sheet of paper.

Preferably, in particular for reasons of pairing, of convenience of packaging, of advertising (logo on the ISO card body), extraction is performed manually by the end-user; to this end, thin pieces material are provided around the adapter and around the mini-UICC in order to extract each of these elements by intentionally pressing them with the fingers or using some other simple means. The thin pieces or pre-cutouts are, for example, formed during the injection molding, as described in Patent FR 2 778 002, or subsequently by mechanical pre-cutting-out.

Preferably, the substrate is an ISO-format substrate so that it is possible to use tooling and machines that are specific to smart card manufacture.

Thus, for example, in the resulting product, the zone reserved for the mini-UICC has cavity for a module (m), the location of which corresponds substantially to the module location in a smart card that complies with the ISO Standard. Integrated-circuit module insertion is thus possible with module insertion machines without requiring many adjustments or adaptations.

Some other location is possible for the cavity in the card body, but that would require the machines to be adapted.

The product obtained prior to extraction can be used as an ISO-format smart card although that is not the purpose for which it is intended, and although said product does not satisfy the ISO criteria in view of the presence of a pre-cutout relating to the adapter.

The zone reserved for the adapter can be disposed at various locations of the card body (outside the zone from which to extract the mini-UICC). However a location is preferred that is such that the contact regions of the small card as positioned in it correspond substantially to the standardized location for the contact regions of an ISO smart card (even after being rotated through 180° in the plane of the card and/or when the card is turned over).

Thus, it is possible to extract the mini-UICC for use in a mobile telephone and then, after the mini-UICC has been re-positioned in the adapter as non-extracted, to obtain a smart-card configuration that has the ISO format.

In accordance with the invention, a first sub-portion of substrate including the mini-UICC and/or the adapter is extracted from the substrate in a prior step.

Figure 4:
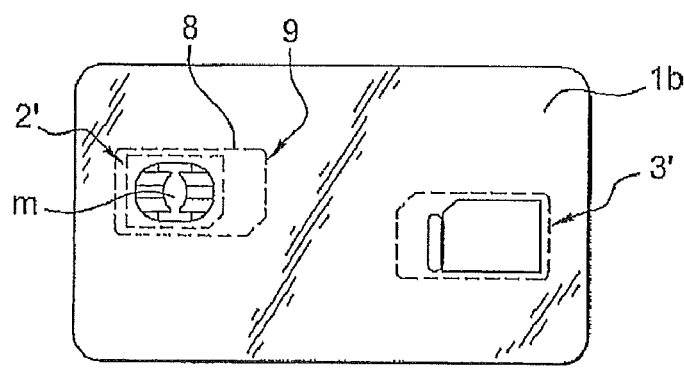
FIG. 4 is a view of FIG. 3 with two pre-cutouts defining the mini-UICC and the "plug-in UICC"

In a particularly remarkable variant shown in FIG. 4, said portion corresponds to the outline of a plug-in UICC. The card 1b includes a zone 8 that is reserved for extraction of a plug-in UICC. This zone can be designed and extracted in the same manner as the other zones for extraction.

Preferably a thin piece or a partial pre-cutout or score line is provided (with or without bridges) corresponding to the outline 9 of a plug-in UICC and facilitating manual extraction thereof.

In the examples, the ISO-format substrate is not designed for use by the end user in the ISO format. Said substrate would not withstand the bending and torsion tests of the ISO Standard.

When the user has two telephones, one designed for a plug-in UICC, and the other designed for a mini-UICC, said user could use them in alternation merely by detaching the mini-UICC, and the adapter.

For use in the plug-in UICC format, it suffices to position the mini-UICC in the adapter as extracted.

In accordance with the invention, it is possible firstly to extract from the substrate at least a second sub-portion of substrate 10a including the small card and/or at least a third sub-portion of substrate 12a including the adapter. Preferably, if extraction is manual, the mini-UICC is extracted first, before the sub-portion 10a is detached.

Figure 5:
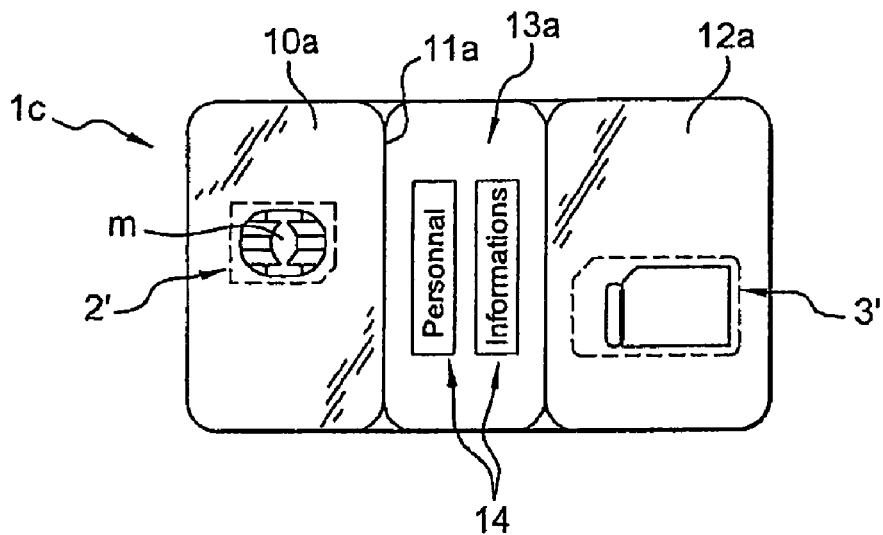
FIGS. 5, 6, and 7 are views of FIG. 3, with sub-portions pre-cut-out from the ISO-format card.
Figure 6:
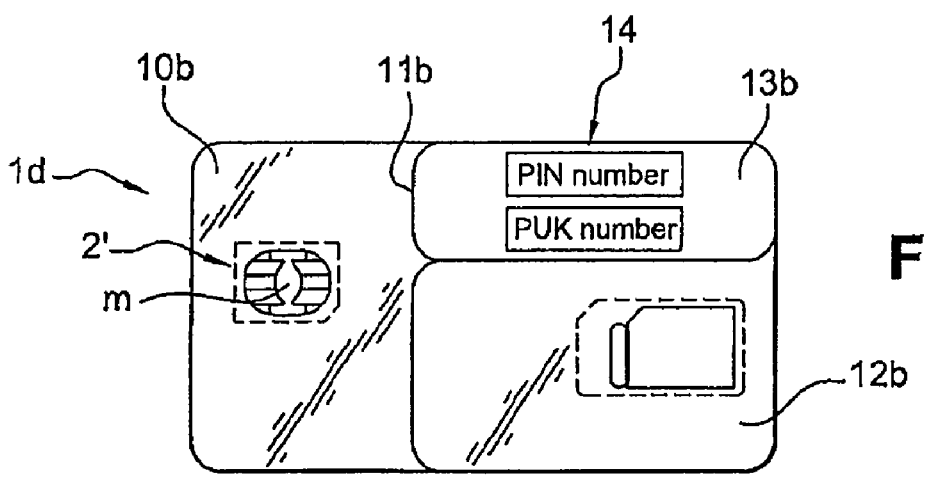
Figure 7:
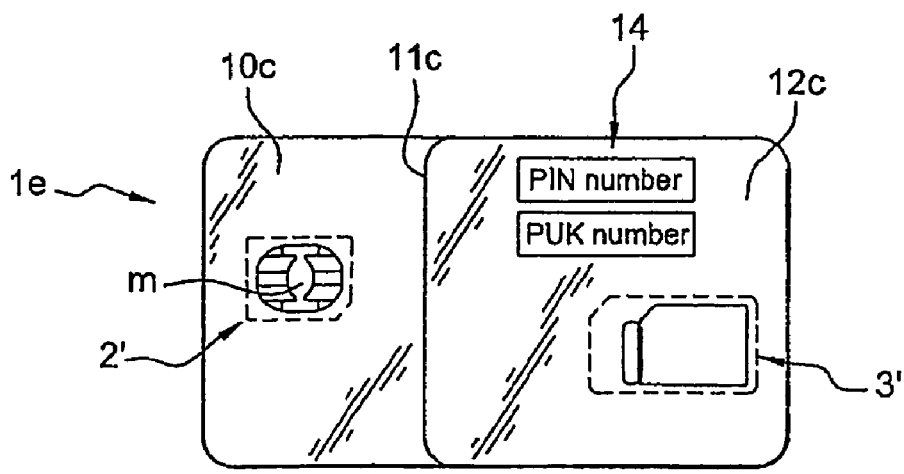

The resulting product is shown in FIGS. 5, 6, and 7. It includes sub-portions 10a, 10b, 10c, and 12a, 12b, 12c respectively for the mini-UICC and for the adapter, which sub-portions, in the examples, can take different shapes, in particular rectangular shapes with substantially rounded corners. These sub-portions can be designed as above (in particular for being injection molded) and can be defined by score lines, respectively 11a, 11b, and 11c, facilitating extraction.

For example, the card bodies (1a to 1e) are 85 mm in length, 54 mm in width, and 760 micrometers (μm) in thickness.

The bodies 1c and 1b include a fifth distinct sub-portion 13a, 13b serving to receive information 14 that can be personal (PIN code) or, for example, can relate to the subscription (PUK unblocking code) at three transverse pre-cutouts. Said information can be on the same sub-portion 12c as the sub-portion that contains the adapter.

The sub-portions have shapes suitable for being handled easily or, for example, for being stored in a wallet, and, in particular, they can be rectangular.

The sub-portions designed to be kept are preferably defined by score lines that form rounded portions at the corners.

Thus, the method is considerably simplified when it uses common steps such as printing and graphics customization (printing a number or a barcode) that are involved in producing all three objects (card, adapter, and information). Insertion machines (machines for inserting modules into the card body cavity) are used, as are testing, packing, and handling machines that are designed for ISO-format cards, even though use of that format is declining.

The residual material remaining after the card and the adapter have been extracted is used judiciously in particular for bearing confidential information relating to the subscriber or for serving as a storage medium that is easy to handle and that can be slipped into a wallet.

Finally, the information that is to be paired with the mini-UICC smart card is necessarily paired by being printed on a common substrate 3. The various sub-portions making up a set are made easier to package and to manage, as is presentation to the customer.

The invention claimed is:

1. A method of manufacturing a smart card having a format that is smaller than a second standard format, and of manufacturing an adapter for adapting to the second format associated with the smart card, said method comprising the following steps:
   supplying a card body having a zone from which to extract the smart card and a zone from which to extract the adapter; and
   extracting the smart card from a zone situated outside a peripheral outline of the zone from which to extract the adapter.

2. A method according to claim 1, wherein the card body includes a substrate that has a prior standard format that is larger than the second format.

3. A method according to claim 1, further comprising a prior step of extracting a sub-portion having the second standard format and including the smart card.

4. A method according to claim 1, further comprising a prior step of extracting a sub-portion of substrate including the smart card from the card body.

5. A method according to claim 1, further comprising a prior step of extracting a second sub-portion of substrate including the adapter from the card body.

6. A method according to claim 1, further comprising a step of extracting at least three sub-portions from the card body, the three sub-portions respectively including said zone from which to extract the smart card, said zone from which to extract the adapter, and personal information.

7. A method according to claim 1, wherein each extraction is performed manually along score lines.

8. A method according to claim 1, wherein each extraction is made by mechanical means.

9. A method according to claim 1, wherein the position of the smart card on the card body is determined such that at least one integrated-circuit module insertion operation is performed substantially in same way as for an ISO-format smart card.

10. A method according to claim 1, wherein pre-cutouts or score lines for the extractions are formed directly in an injection mold during a plastics injection molding operation for molding the card body.

11. A smart card substrate including a zone from which to extract a smart card having a format that is smaller than a second standard format, and a zone from which to extract an adapter for adapting the smart card to the second format;
   wherein the zone from which to extract the smart card is situated outside the peripheral outline of the zone from which to extract the adapter.

12. A smart card substrate according to claim 11, wherein the substrate has a standard format that is larger than the second format.

13. A smart card substrate according to claim 11, wherein said substrate includes a first sub-portion having the second standard format and including the smart card.

14. A smart card substrate according to claim 13, wherein said substrate includes a second sub-portion including the smart card.

15. A smart card substrate according to to claim 14, wherein the substrate includes a third sub-portion including the adapter.

16. A smart card substrate according to claim 11, wherein the various extraction zones are defined or marked by score lines facilitating manual extraction.

17. A smart card substrate according to claim 11, wherein the substrate includes information and a score line isolating the information on a detachable sub-portion of substrate.

18. A smart card substrate according to claim 17, wherein the substrate includes at least three detachable sub-portions defined by score lines and respectively including said zone from which to extract the smart card, said adapter, and said information.

19. A substrate according to claim 17, wherein said information includes information relating to PIN and/or PUK codes.

20. A smart card substrate according to claim 11, wherein the smart card has contact regions that correspond substantially to the standardized locations of contact regions on an ISO smart card.

21. A smart card substrate according to claim 11, wherein the adapter has a location in the substrate such that the contact regions of the smart card, as placed in it, correspond substantially to the standardized locations of contact regions of an ISO smart card.

* * * * *